(12) United States Patent
Liu et al.

(10) Patent No.: US 10,312,249 B2
(45) Date of Patent: Jun. 4, 2019

(54) METHOD FOR FORMING A SEMICONDUCTOR DEVICE

(71) Applicant: UNITED MICROELECTRONICS CORP., Hsinchu (TW)

(72) Inventors: Wei-Chang Liu, Singapore (SG); Zhen Chen, Singapore (SG); Shen-De Wang, Hsinchu County (TW); Chuan Sun, Singapore (SG); Wei Ta, Singapore (SG); Wang Xiang, Singapore (SG)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 15/808,019

(22) Filed: Nov. 9, 2017

(65) Prior Publication Data

US 2019/0139971 A1    May 9, 2019

(51) Int. Cl.

| | |
|---|---|
| H01L 27/11531 | (2017.01) |
| H01L 27/11521 | (2017.01) |
| H01L 29/423 | (2006.01) |
| H01L 29/66 | (2006.01) |
| H01L 21/28 | (2006.01) |
| H01L 21/3215 | (2006.01) |
| H01L 21/266 | (2006.01) |
| H01L 29/788 | (2006.01) |

(52) U.S. Cl.
CPC ...... *H01L 27/11531* (2013.01); *H01L 21/266* (2013.01); *H01L 21/28273* (2013.01); *H01L 21/32155* (2013.01); *H01L 27/11521* (2013.01); *H01L 29/42328* (2013.01); *H01L 29/66825* (2013.01); *H01L 29/7881* (2013.01)

(58) Field of Classification Search
CPC combination set(s) only.
See application file for complete search history.

(56) References Cited

U.S. PATENT DOCUMENTS

| | | | |
|---|---|---|---|
| 2015/0380568 A1* | 12/2015 | Tseng | H01L 29/792 257/326 |
| 2016/0020219 A1* | 1/2016 | Chuang | H01L 27/11573 257/324 |

* cited by examiner

*Primary Examiner* — Ratisha Mehta
(74) *Attorney, Agent, or Firm* — WPAT, PC

(57) ABSTRACT

A method for forming a semiconductor device is provided, including providing a substrate having a first area comprising first semiconductor structures and a second area, wherein one of the first semiconductor structures comprises a memory gate made of a first polysilicon layer, and a second semiconductor structure comprises a second polysilicon layer disposed within the second area on the substrate; forming an organic material layer on the first semiconductor structures within the first area and on the second polysilicon layer within the second area; and patterning the organic material layer to form a patterned organic material layer, and the organic material layer exposing the memory gates of the first semiconductor structures, wherein a first pre-determined region and a second pre-determined region at the substrate are covered by the patterned organic material layer.

16 Claims, 5 Drawing Sheets

METHOD FOR FORMING A SEMICONDUCTOR DEVICE

BACKGROUND

Technical Field

The disclosure relates in general to a method for forming a semiconductor device, and more particularly to a mask reduction method for forming a semiconductor device.

Description of the Related Art

Reduction of feature size, improvements of the rate, the efficiency, the density and the cost per integrated circuit unit are the important goals in the semiconductor technology. The electrical properties of the device have to be maintained even improved (ex: with the decrease of the size) to meet the requirements of the commercial products in applications. The layers and components with defects, such as position misalignment, incomplete profiles and thickness changes of the layers, would have considerable effects on the electrical performance of the device.

For example, during fabricating a semiconductor device with memory cells and logic cells, blanket implantation for the entire area of the semiconductor device would lead to the logic poly-gate with an under-cut profile or undesired implant to the source region and the drain region of the memory cells. This would cause the considerable effects on the electrical characteristics of the semiconductor device.

SUMMARY

The disclosure is directed to a method for forming a semiconductor device, wherein one mask N+ poly implantation after flash cell formation can be conducted without deteriorating the electrical properties of the semiconductor structures.

According to one aspect of the present disclosure, a method for forming a semiconductor device is provided, including:

providing a substrate having a first area comprising first semiconductor structures and a second area, wherein one of the first semiconductor structures comprises a memory gate made of a first polysilicon layer, and a second semiconductor structure comprising a second polysilicon layer disposed within the second area on the substrate;

forming an organic material layer on the first semiconductor structures within the first area and on the second polysilicon layer within the second area; and patterning the organic material layer to form a patterned organic material layer, and the organic material layer exposing the memory gates of the first semiconductor structures, wherein a first pre-determined region and a second pre-determined region at the substrate are covered by the patterned organic material layer.

Figure 1A:
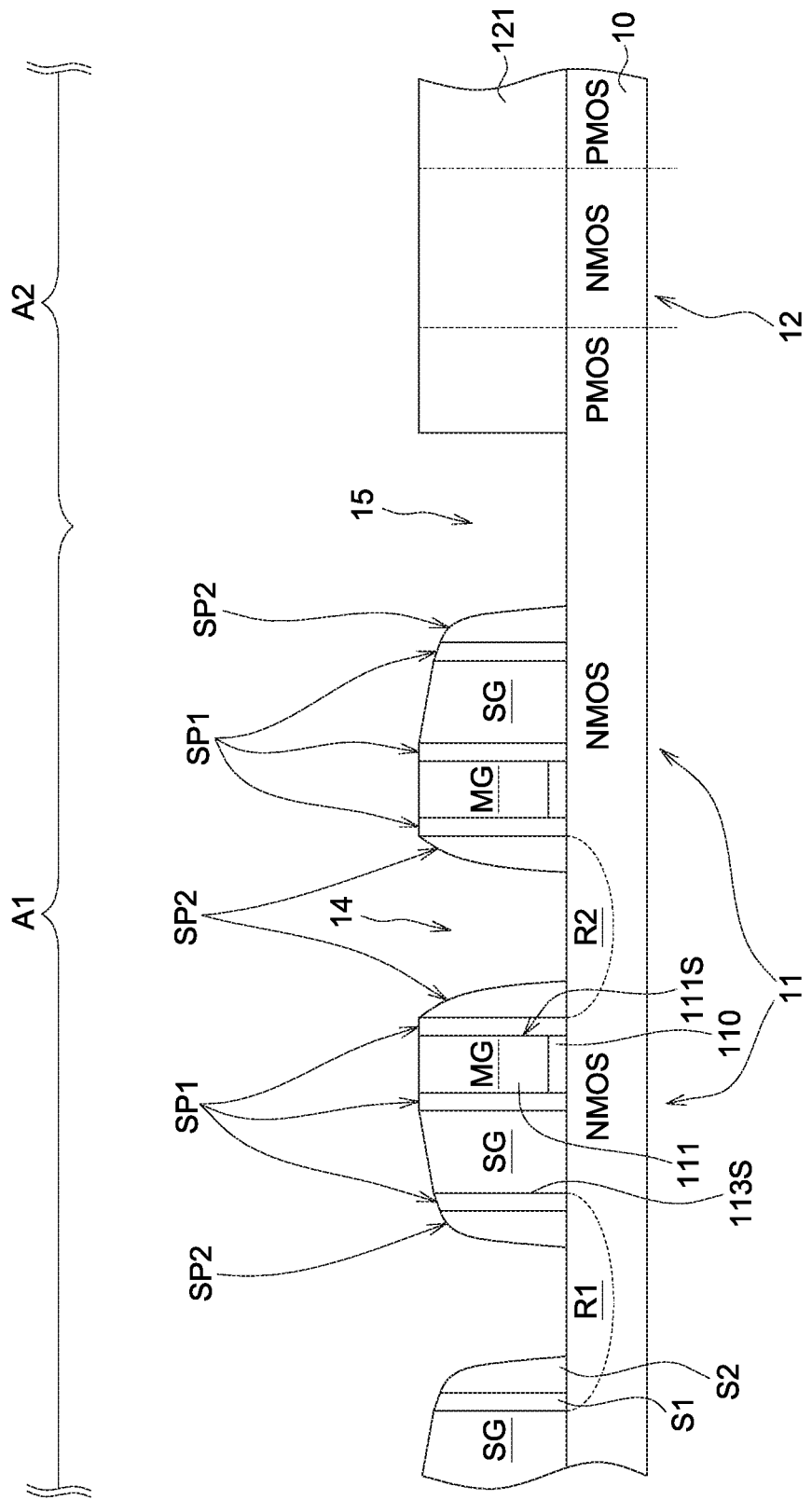
FIG. 1A-FIG. 1E illustrate a method for forming a semiconductor device according to one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

In the embodiment of the present disclosure, a method for forming a semiconductor device is provided. In particular, a method for forming a semiconductor device having embedded flash memory cells and logic cells is provided. According to the embodiments, an organic material layer is deposited before N+ poly implantation, followed by embodied procedures, so that one mask N+ poly implantation after flash cell formation is required and conducted without deteriorating the electrical properties of the semiconductor structures such as flash memory cells. In addition, according to the embodied method, the implant concentration and profiles of the gates of the semiconductor structures (such as memory gates of the flash memory cells and the logic gates of the logic cells) can be well-defined without forming under-cut profile. Also, the thermal budget of the polysilicon layers for forming the gates of the semiconductor structures can be well controlled.

The embodiments can be applied to manufacture different types of semiconductor devices, such as applied for forming a semiconductor device having embedded flash memory cells and logic cells, wherein one mask N+ poly implantation after flash memory cell formation is conducted. Embodiments are provided hereinafter with reference to the accompanying drawings for describing the related procedures and configurations. For example, a semiconductor device having the first gate structures with narrower gate lengths in the first area and the second gate structures with wider gate lengths in the second area is exemplified for illustration. However, the present disclosure is not limited thereto. It is noted that not all embodiments of the invention are shown. The identical and/or similar elements of the embodiments are designated with the same and/or similar reference numerals. Also, it is noted that there may be other embodiments of the present disclosure which are not specifically illustrated. Modifications and variations can be made without departing from the spirit of the disclosure to meet the requirements of the practical applications. It is also important to point out that the illustrations may not necessarily be drawn to scale. Thus, the specification and the drawings are to be regard as an illustrative sense rather than a restrictive sense.

Moreover, use of ordinal terms such as "first", "second", "third" etc., in the specification and claims to describe an element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

FIG. 1A-FIG. 1E illustrate a method for forming a semiconductor device according to one embodiment of the disclosure. The identical elements in the drawings would be designated with the same reference numerals for the purpose of clear illustration.

First, a substrate 10 having a first area A1 and a second area A2 is provided, wherein several first semiconductor structures 11 are disposed within the first area A1 and a second semiconductor structure 12 is disposed within the second area A2, as shown in FIG. 1A. Also, one of the first semiconductor structures 11 comprises a memory gate MG made of a first polysilicon layer 111, and the second semiconductor structure 12 comprising a second polysilicon layer 121 disposed within the second area A2 on the substrate 10, wherein the first polysilicon layers 111 and the second polysilicon layer 121 are formed of non-implanted polysilicon before performing the next step (i.e. forming an organic material layer). In this embodiment, the first semiconductor structures 11 are flash memory structures and the second semiconductor structure 12 is a logic structure as exemplification.

In one example, a flash memory structure (i.e. the first semiconductor structure 11) comprises a memory gate MG, a select gate SG and a spacer structure. Also, a first pre-determined region R1 and a second pre-determined region R2 (such as a source doping region and a drain doping region respectively) are defined by the spacer structure, wherein the spacer structure is disposed correspondingly to the sidewalls 111S of the memory gate MG and the sidewalls 113S of the select gate SG, as shown in FIG. 1A.

In one embodiment, the spacer structure comprises: the first spacers SP1 and the second spacers SP2. For one of the first semiconductor structures 11, a first spacer SP1 is disposed between the memory gate MG and the select gate SG, and two of the first spacers SP1 are disposed at the sidewalls 111S of the memory gate MG and the sidewalls 113S of the select gate SG, respectively. The second spacers SP2 are disposed at the outer sidewalls of the first spacers SP1. Also in the drawings of the embodiment, a single layer is depicted as the first spacer SP1. However, the first spacer SP1 can be a single layer or a multilayer, the disclosure has no particular limitation thereto. For example, the first spacer SP1 may comprise an oxide layer, a nitride layer, or a combination thereof.

In the step of FIG. 1A, the select gate SG may comprise doped polysilicon, while the first polysilicon layers 111 (of the memory gate MG) and the second polysilicon layer 121 are formed of non-implanted polysilicon. An oxide-nitride-oxide (ONO) layer 110 is disposed between the memory gate MG and a dielectric layer (formed on the substrate 10, not shown in the drawings). Also, the memory gate MG and the select gate SG are separated by the first spacer SP1.

Additionally, for the configurations of the first semiconductor structures 11 and the second semiconductor structure 12, a first space 14 and a second space 15 are further defined, for illustrating the embodiment. A first space 14 is defined as a space between two flash memory structures (i.e. the first semiconductor structures 11) disposed adjacently. A second space 15 is defined as a space between the logic structure (i.e. the second semiconductor structure 12) and one of the flash memory structures disposed adjacently. In the embodied method, those spaces (i.e. the first spaces 14 and the second spaces 15) between the semiconductor structures will be covered by an organic material layer subsequently.

Figure 1B:
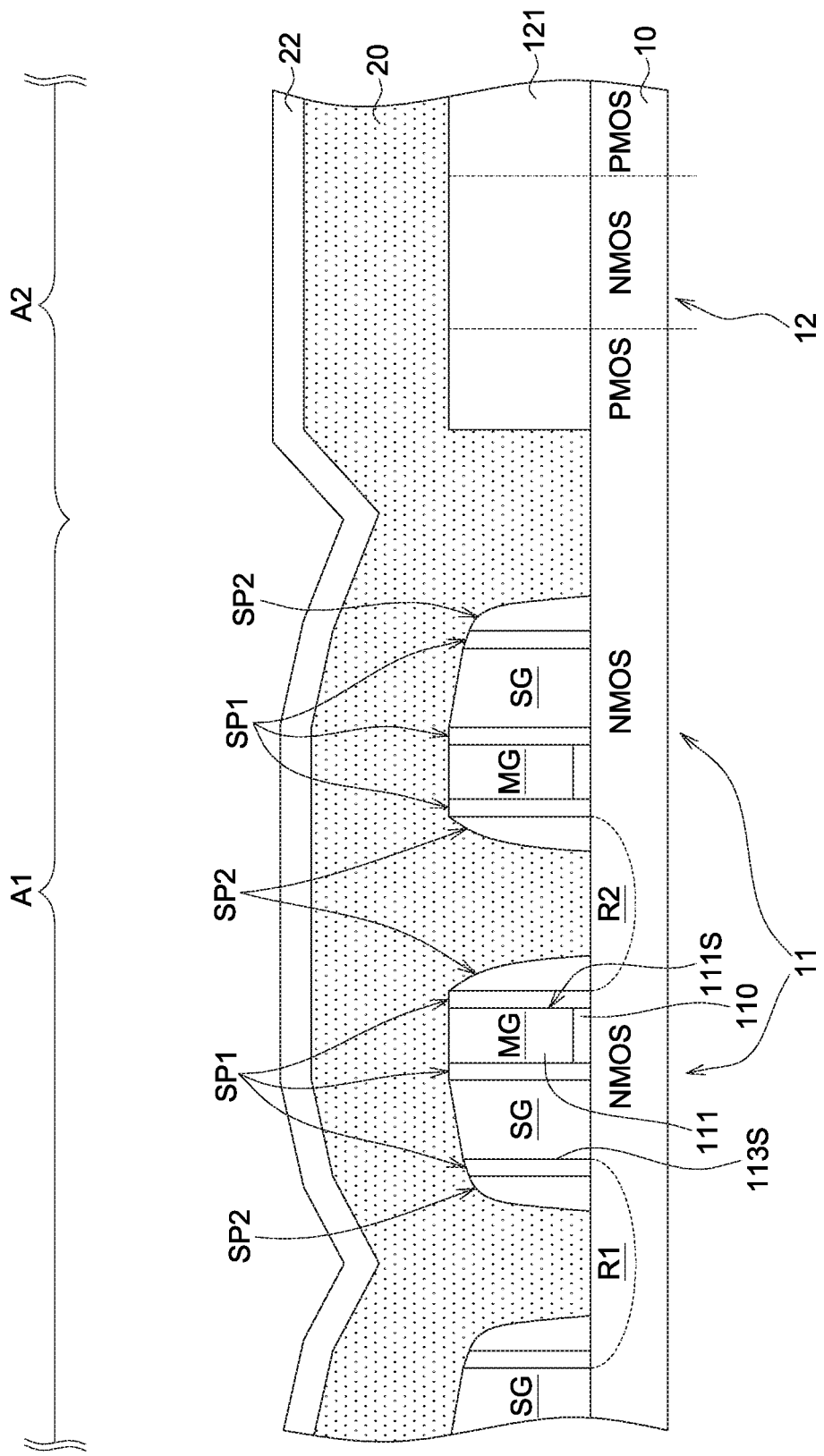

As shown in FIG. 1B, an organic material layer 20 is formed on the first semiconductor structures 11 (ex: flash memory structures) within the first area A1 and on the second polysilicon layer 121 within the second area A2. In one embodiment, the organic material layer 20 fully covers the first semiconductor structures 11 (ex: flash memory structures) and the second polysilicon layer 121. Also, the organic material layer 20 fills a space between the second polysilicon layer 121 and at least one of the flash memory structures disposed adjacently. For example, the organic material layer 20 fully fills the first space 14 between the flash memory structures (i.e. the first semiconductor structures 11) disposed adjacently, and fully fills the second space 15 between the logic structure and the flash memory structure disposed adjacently, as shown in FIG. 1B.

In one embodiment, the organic material layer 20 comprises at least one of an advance patterning film (APF), an organic dielectric layer (ODL), a silicon-containing organic layer (ex: SHB, BARC) and a photo-resist (PR) layer. In one example, an ADF can be selected as (but not limited to) the organic material layer 20. Also, other organic film(s) could be formed on the organic material layer 20 optionally. For example, a SiO2 layer 22 can be optionally formed on the organic material layer 20.

Figure 1C:
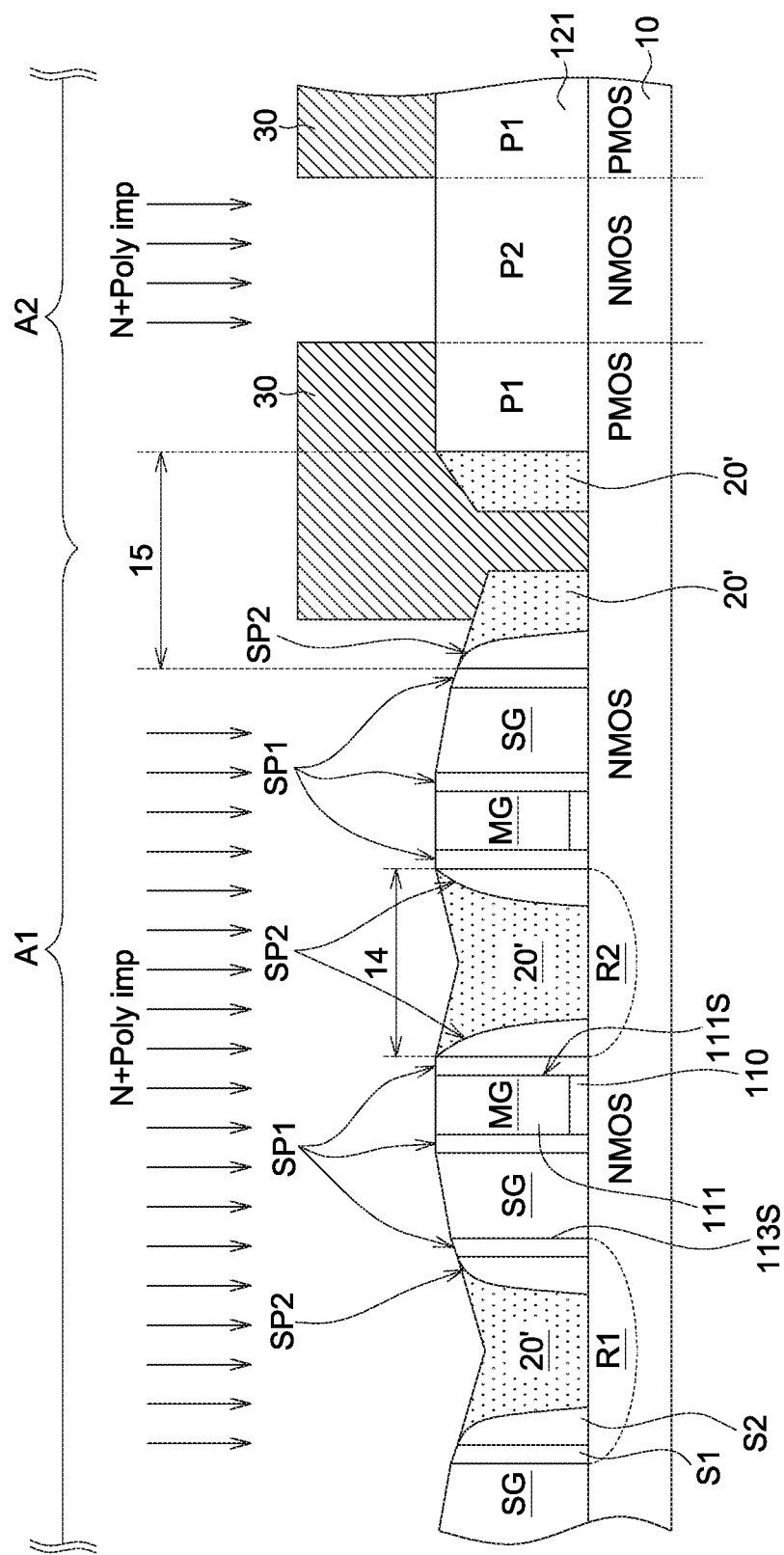

Afterwards, the organic material layer 20 is patterned (such as etched), so as to expose at least the memory gates MG of the first semiconductor structures 11 and form a patterned organic material layer 20', as shown in FIG. 1C. In one embodiment, the patterned organic material layer 20' fully fills a first space 14 between adjacent flash memory structures, wherein the first pre-determined region R1 and the second pre-determined region R2 at the substrate 10 positioned correspondingly to the first space 14 are covered by the patterned organic material layer 20'. Then, a patterned photo-resist layer 30 is formed on the patterned organic material layer 20', followed by simultaneously implanting the first polysilicon layers 111 (of the memory gates MG) and the second polysilicon layer 121, as shown in FIG. 1C. In one embodiment, N+ poly implantation is performed for implanting the first polysilicon layers 111 (of the memory gates MG) and parts of the second polysilicon layer 121 (ex: corresponding to NMOS).

According to the practical applications, the flash memory structures (in the first area A1) are usually distributed more densely and the logic structures (in the second area A2) are distributed loosely, wherein the first space 14 is narrower than the second space 15 (from a top view of the substrate 10). In one embodiment, the patterned photo-resist layer 30 can be further spans over the second space 15 (ex: photo-resist pull back); for example, the patterned organic material layer extends to be formed on the patterned organic material layer 20' disposed at the second space 15.

Also, in the step of forming the patterned photo-resist layer 30 and implanting the first and second polysilicon layers (FIG. 1C), the patterned photo-resist layer 30 shields a first part P1 (ex: PMOS) of the second polysilicon layer 121 and un-shields a second part P2 (ex: NMOS) of the second polysilicon layer 121, so that the first polysilicon layer 111 and the second part P2 of the second polysilicon layer 121 are implanted simultaneously.

Figure 1D:
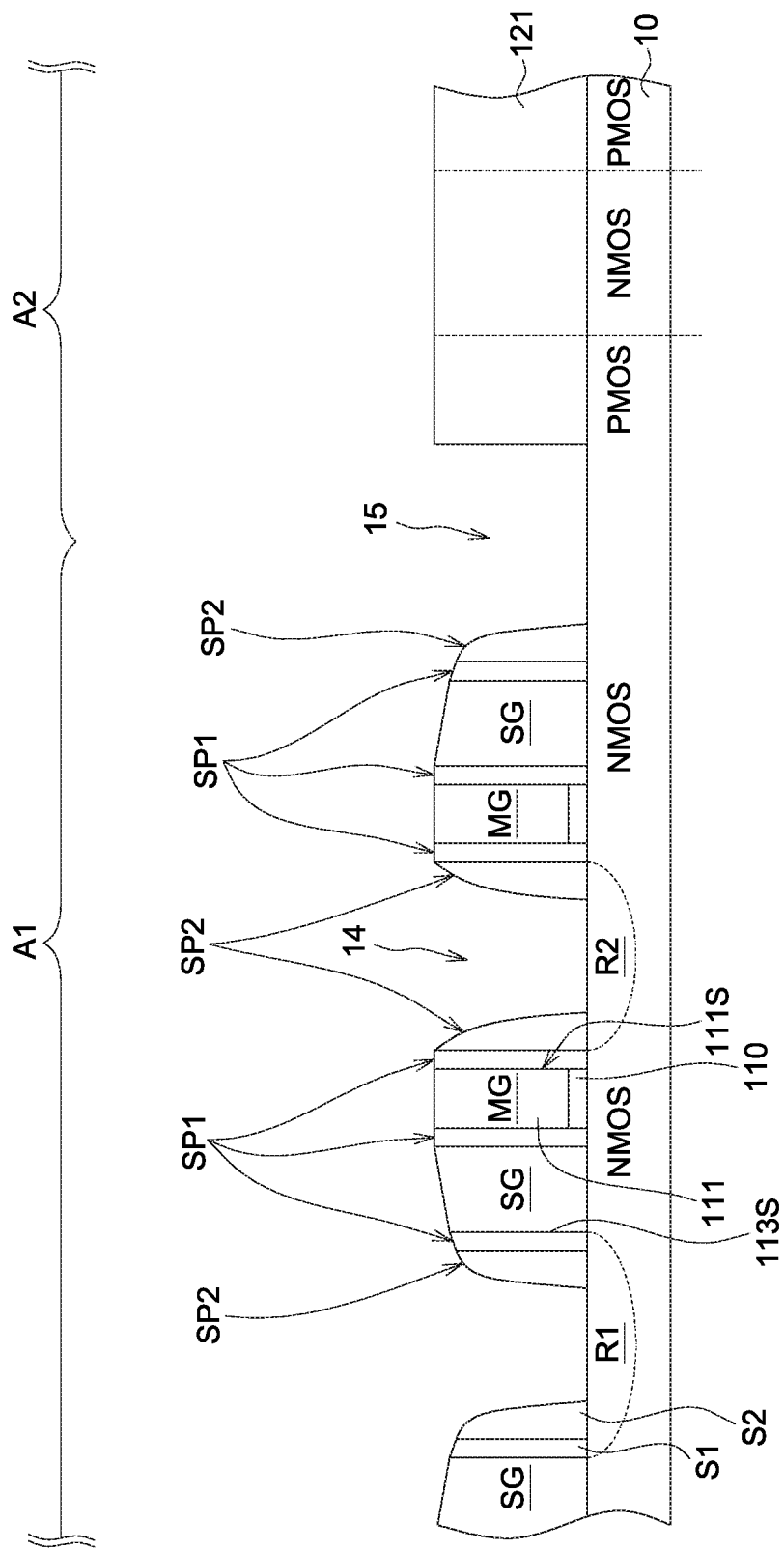

After implanting the first polysilicon layer 111 and the second polysilicon layer 121 simultaneously, the patterned photo-resist layer 30 and the patterned organic material layer 20' are removed, as shown in FIG. 1D.

Figure 1E:
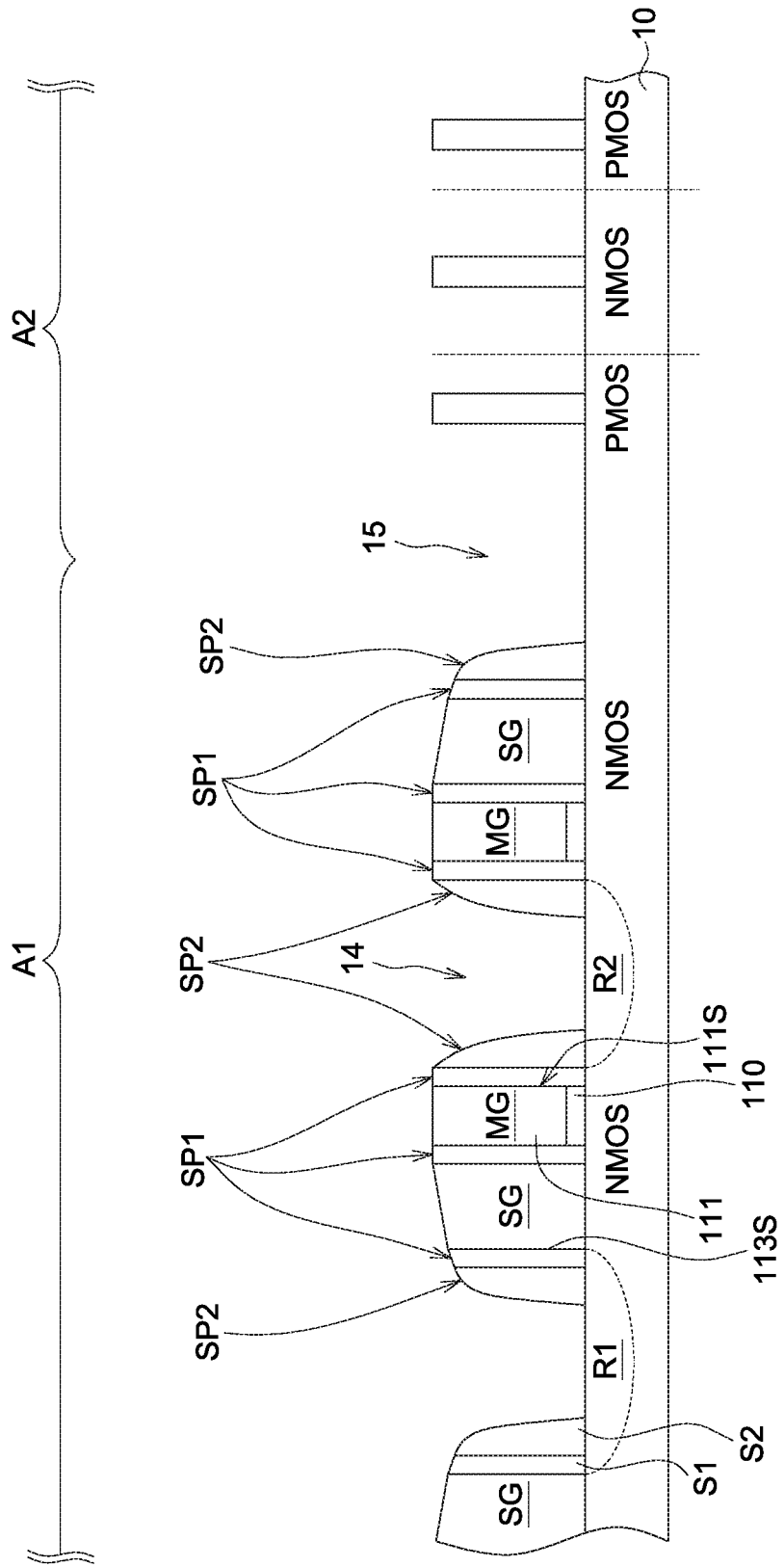

Afterwards, fabrication of the second semiconductor structure is conducted. In one embodiment, the hard mask (HM) is deposited on the N+poly polysilicon layer 121 in the second area A2, followed by patterning such as etching to form the logic gate, as shown in FIG. 1E. Other related elements for completing the second semiconductor structure are constructed subsequently, and the details are known in the art and would not be redundantly described.

The embodied method with reference to the accompanying drawings such as FIG. 1A-FIG. 1E is exemplified for illustrating the applicable procedures. However, other modifications could be adopted according to the situations of the practical applications. For example, in an alternative embodiment, if the space (ex: the second space 15) between the logic structure (ex: the second semiconductor structure 12) and one of the flash memory structures (ex: the first semiconductor structure 11) disposed adjacently is large, the patterned photo-resist layer 30 may merely cover part of the patterned organic material layer 20' at the edges of the second polysilicon layer 121 and does not extend to cover another part of the patterned organic material layer 20' at the second spacers SP2 of the flash memory structure (i.e. the patterned photo-resist layer 30 does not span over the second space 15).

According to an embodied method in the aforementioned descriptions, an organic material layer 20 is deposited before N+ poly implantation (FIG. 1B and FIG. 1C). The patterned organic material layer 20' as formed covers the first pre-determined region R1 and the second pre-determined region R2 at the substrate 10. After forming a patterned photo-resist layer 30 on the patterned organic material layer 20', the first polysilicon layer 111 and the second polysilicon layer 121 are subjected to N+ poly implantation simultaneously. The first pre-determined region R1 and the second pre-determined region R2 would be a source region and a drain region of the one of the flash memory structures in the subsequent process (S/D are formed by doping the first pre-determined region and the second pre-determined region after removing the patterned organic material layer 20'). Since the first and second pre-determined regions in the first area are covered by the patterned organic material layer, the S/D regions would not receive N+ poly implants during the implanting step. Thus, according to the embodied method, one mask N+ poly implantation after flash cell formation can be conducted without deteriorating the electrical properties of the flash memory cells. Also, since the N+ poly implantation is performed after formation of the flash memory structures and a patterned organic material layer 20', the implant concentration and profiles of the poly-gate and S/D regions of the flash memory structures (in the first area A1) and the logic gate of the logic structures (in the second area A2) can be well-defined without forming under-cut profile. In addition, the thermal budget of the polysilicon layers (111/121) for forming the memory gates of the flash memory structures and the logic gates of the logic structures can be well controlled. Additionally, the embodied method is compatible with the current process, which is suitable for mass production.

Other embodiments with different configurations of known elements in the semiconductor devices can be applicable, and the arrangement of the elements depends on the actual needs of the practical applications. It is, of course, noted that the configurations of figures are depicted only for demonstration, not for limitation. It is known by people skilled in the art that the shapes or positional relationship of the constituting elements and the procedure details could be adjusted according to the requirements and/or manufacturing steps of the practical applications without departing from the spirit of the disclosure.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for forming a semiconductor device, comprising:
    providing a substrate having a first area comprising first semiconductor structures and a second area, wherein one of the first semiconductor structures comprises a memory gate made of a first polysilicon layer, and a second semiconductor structure comprising a second polysilicon layer disposed within the second area on the substrate;
    forming an organic material layer on the first semiconductor structures within the first area and on the second polysilicon layer within the second area;
    patterning the organic material layer to form a patterned organic material layer, and the patterned organic material layer exposing the memory gates of the first semiconductor structures, wherein a first pre-determined region and a second pre-determined region at the substrate are covered by the patterned organic material layer;
    forming a patterned photo-resist layer on the patterned organic material layer; and
    implanting the first polysilicon layer and the second polysilicon layer simultaneously.

2. The method according to claim 1, wherein the patterned organic material layer fully fills a first space between adjacent first semiconductor structures, wherein the first pre-determined region and second pre-determined region at the substrate are positioned correspondingly to the first space.

3. The method according to claim 2, wherein the patterned organic material layer fully fills a second space between the second semiconductor structure and one of the first semiconductor structures disposed adjacently.

4. The method according to claim 3, wherein the first space is narrower than the second space.

5. The method according to claim 3,
    wherein the patterned photo-resist layer further spans over the second space.

6. The method according to claim 1, wherein the first semiconductor structures are flash memory structures and the second semiconductor structure is a logic structure.

7. The method according to claim 6, wherein said one of the flash memory structures further comprises a select gate and a spacer structure, wherein the first pre-determined region and the second pre-determined region are defined by the spacer structure disposed correspondingly to sidewalls of the memory gate and sidewalls of the select gate.

8. The method according to claim 7, wherein the spacer structure comprises:
    first spacers, at least one of the first spaces disposed between the memory gate and the select gate, and two of the first spaces respectively disposed at the sidewalls of the memory gate and the sidewalls of the select gate; and
    second spacers, disposed at outer sidewalls of the first spacers.

9. The method according to claim 1, wherein the organic material layer fully covers the first semiconductor structures within the first area and the second polysilicon layer within the second area.

10. The method according to claim 1, wherein the patterned organic material layer fully fills a space between the second polysilicon layer and at least one of the first semiconductor structures disposed adjacently.

11. The method according to claim 1, wherein the organic material layer comprises at least one of an advance patterning film, an organic dielectric layer, a silicon-containing organic layer and a photo-resist layer.

12. The method according to claim 1, wherein the patterned photo-resist layer shields a first part of the second polysilicon layer and un-shields a second part of the second polysilicon layer, so that the first polysilicon layer and the second part of the second polysilicon layer are implanted simultaneously.

13. The method according to claim 1, further comprising: removing the patterned photo-resist layer and the patterned organic material layer after simultaneously implanting the first polysilicon layer and the second polysilicon layer.

14. The method according to claim 1, wherein the patterned photo-resist layer formed on the patterned organic material layer further spans over a space between the second polysilicon layer and at least one of the first semiconductor structures disposed adjacently.

15. The method according to claim 1, wherein the first polysilicon layers and the second polysilicon layer are formed of non-implanted polysilicon before forming the organic material layer.

16. The method according to claim 1, wherein the first pre-determined region and the second pre-determined region are a source doping region and a drain doping region of the one of the flash memory structures, respectively.

* * * * *